United States Patent [19]

Bloechle et al.

[11] Patent Number: 4,737,208
[45] Date of Patent: Apr. 12, 1988

[54] METHOD OF FABRICATING MULTILAYER STRUCTURES WITH NONPLANAR SURFACES

[75] Inventors: Donald P. Bloechle, Rockaway, N.J.; Mohanan P. Kalliat, Richmond; William A. Mazeika, Mechanicsville, both of Va.

[73] Assignees: American Telephone and Telegraph Company, AT&T Bell Laboratories, Murray Hill; AT&T Technologies, Inc., Berkeley Heights, both of N.J.

[21] Appl. No.: 912,874

[22] Filed: Sep. 29, 1986

[51] Int. Cl.4 .................. B32B 31/20; B32B 33/00
[52] U.S. Cl. ..................... 156/90; 156/289; 156/323; 156/583.3; 428/157; 428/172; 428/189
[58] Field of Search .......... 156/90, 289, 323, 583.3; 428/157, 172, 189, 190

[56] References Cited

U.S. PATENT DOCUMENTS

| | | | |
|---|---|---|---|
| 4,626,309 | 12/1986 | Mullen et al. | 156/289 |
| 4,636,275 | 1/1987 | Norell | 156/289 |
| 4,643,935 | 2/1987 | McNeal et al. | 428/157 |
| 4,680,075 | 7/1987 | McNeal et al. | 156/289 |

OTHER PUBLICATIONS

"Tedlar" PVF Film Technical Bulletin, DuPont Co., No. TD-34 (Jan. 1982).
"Fabrication of FR-4 Pin-Grid Arrays", Proceedings of the National Electronic Packaging and Production Conference, Feb. 25-27, 1986, pp. 889-897, Nagy.

Primary Examiner—Robert A. Dawson
Attorney, Agent, or Firm—Lester H. Birnbaum

[57] ABSTRACT

Disclosed is a method for laminating multilayer structures with nonplanar surfaces such as structures which include cavity (20) formed therein. A conformal material (32), a release material (31), and an optional template (36) are provided over the structure prior to the lamination bonding operation. The conformal and release materials then fill the cavity during the bonding operation to prevent flow of adhesive (25 and 26) from between the layers into the cavity, and the template redistributes cavity edge stresses to minimize wire bonding pad deflections. The materials can then be removed for further processing of the multilayer structure.

14 Claims, 3 Drawing Sheets

METHOD OF FABRICATING MULTILAYER STRUCTURES WITH NONPLANAR SURFACES

BACKGROUND OF THE INVENTION

One of the contenders for future semiconductor electronic packaging schemes is the chip cavity multilayer board. The structure basically comprises multiple layers of printed wiring board material with conductors on one or more major surfaces of each layer. The layers are bonded together by an appropriate adhesive. Included in the structure is a cavity where the semiconductor chip is bonded and electrically connected to pads on the various layers. This chip cavity multilayer board can then be attached to a standard printed wiring board including other components.

One of the problems associated with fabricating this structure involves bonding together the various layers. If not properly controlled, the adhesive tends to flow from between the layers of printed wiring board material into the cavity as a result of the application of heat and pressure during bonding. This results in tight manufacturing tolerances, since too little flow of the adhesive can result in lack of circuit encapsulation and voids between the layers.

It is, therefore, a primary object of the invention to provide a method of manufacturing multiple layer structures with cavities therein so as to prevent the flow of adhesive from between the layers into the cavity and yet insure adequate circuit encapsulation.

Another problem associated with fabricating this type of structure involves the bending and deformation of wire bonding pads during the bonding process. Deformed and distorted wire bonding pads are not suitable for automated wire bonding assembly of the chip.

It is, therefore, a secondary objective of the invention to provide a method of manufacturing multiple layer structures with cavities therein so as to prevent the bending and distortion of wire bonding pads that can interfere with automated wire bonding.

SUMMARY OF THE INVENTION

At least the primary object is achieved in accordance with the invention which is a method of fabricating a multilayer structure which includes a nonplanar surface defined by said layers. A flowable adhesive is provided between the layers for bonding the layers together. A release material and a conformal material are provided over the structure including the cavity. Heat and pressure are applied to the structure to cause the conformal and release materials to fill the recesses in the nonplanar surface and thereby prevent the flow of the adhesive into the recesses.

BRIEF DESCRIPTION OF THE DRAWING

These and other features of the invention are delineated in detail in the following description. In the drawings.

It will be appreciated that, for the sake of illustration, these figures are not necessarily drawn to scale.

DETAILED DESCRIPTION

Figure 1:
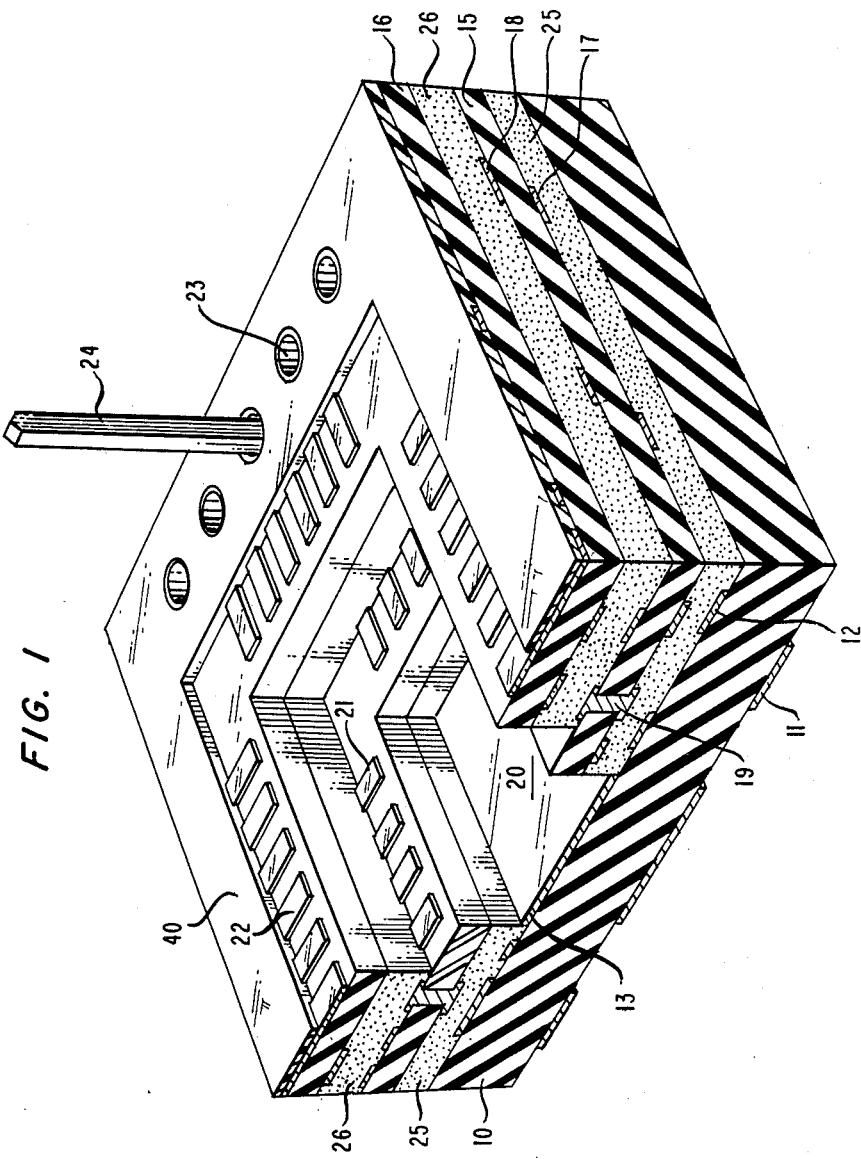
FIG. 1 is a perspective, cut-away view of a typical multilayer structure which may be fabricated in accordance with the invention.

FIG. 1 illustrates a typical cavity multilayer board which can be fabricated in accordance with the invention. The bottom substrate layer, 10, in this example, is a mixture of bismaleimide, triazine and epoxy, and includes conductive elements, e.g., 11 and 12, on both major surfaces. Also included on the substrate is a conductive pad 13 for bonding a semiconductor chip thereto (not shown). Multiple layers, 15 and 16, are located over and properly registered with the substrate, 10. These layers are typically the same type of printed wiring board laminate material as the substrate and also include conductive members on both major surfaces, e.g., 17 and 18, as well as via holes, e.g., 19, electrically connecting the conductors on opposite surfaces.

The multiple layers, 15 and 16, define a cavity, 20, for placement of the chip. The cavity typically measures approximately 0.9 cm × 1.2 cm at its base and 1.0 cm × 1.3 cm at the top with a height of 0.065 cm. Conductive pads, e.g., 21 and 22, are included on the top surfaces of the two layers, 15 and 16, near the edges defining the cavity so that electrical connections can be made to the chip by wire bonding to the pads.

Plated through holes, e.g., 23, are provided through the entire structure so that conductive pins, such as 24 may be inserted therein. These pins provide the electrical connection to the next level of interconnection such as a printed wiring board.

The multiple layers, 15 and 16, are typically bonded to the substrate and to each other by an appropriate adhesive, 25 and 26, provided between the substrate and first layer (15) and between the first and second (16) layers. The adhesive is typically a no flow or low flow, partially polymerized, material which is preimpregnated with glass fabric (known in the art as B-stage prepreg adhesive). In this example, the adhesive was a bismaleimide-triazine-expoxy mixture impregnated with E-glass (electrical grade) fabric. Other standard adhesives can be employed. Two or more adhesive layers are stacked and aligned in the structure after appropriate cavity cutouts are formed in each layer. Next, heat and pressure are applied to form a permanent bond between the layers. The bonding is typically done by increasing the temperature at a rate in the range of 5° C./minute–30° C./minute to a maximum temperature in the range 160°–190° C. which is held for a period of 30–90 minutes. The applied pressure is typically, 0.8–4.8 megapascals. This bonding causes the adhesive to flow and can, therefore, result in adhesive flowing into the cavity (including the area over the bonding pads 21).

Figure 2:
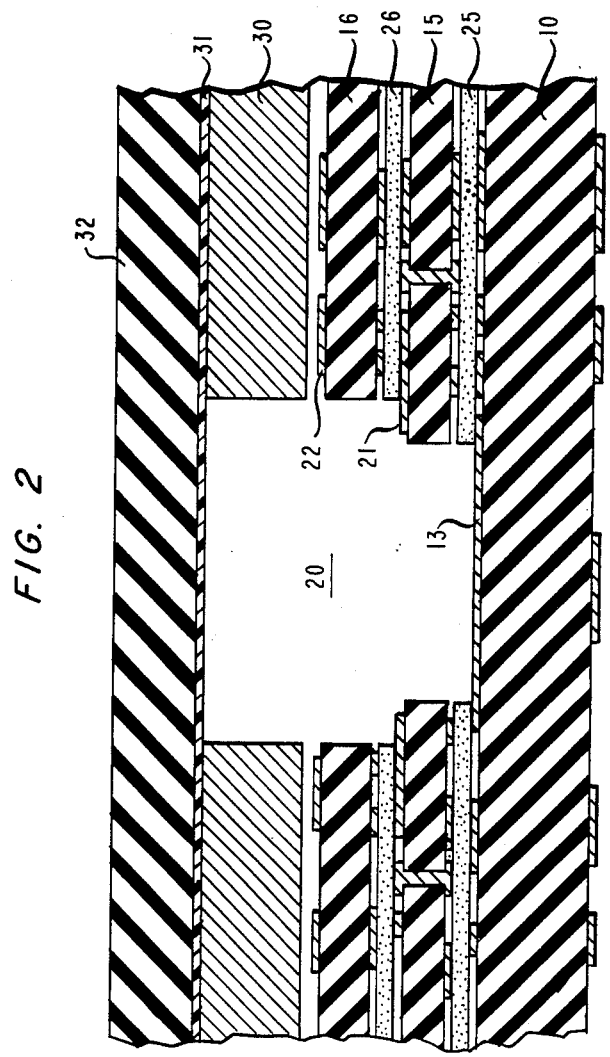
FIGS. 2-3 are cross-sectional views of the multilayer structure of FIG. 1 during different stages of fabrication in accordance with one embodiment of the invention.
Figure 3:
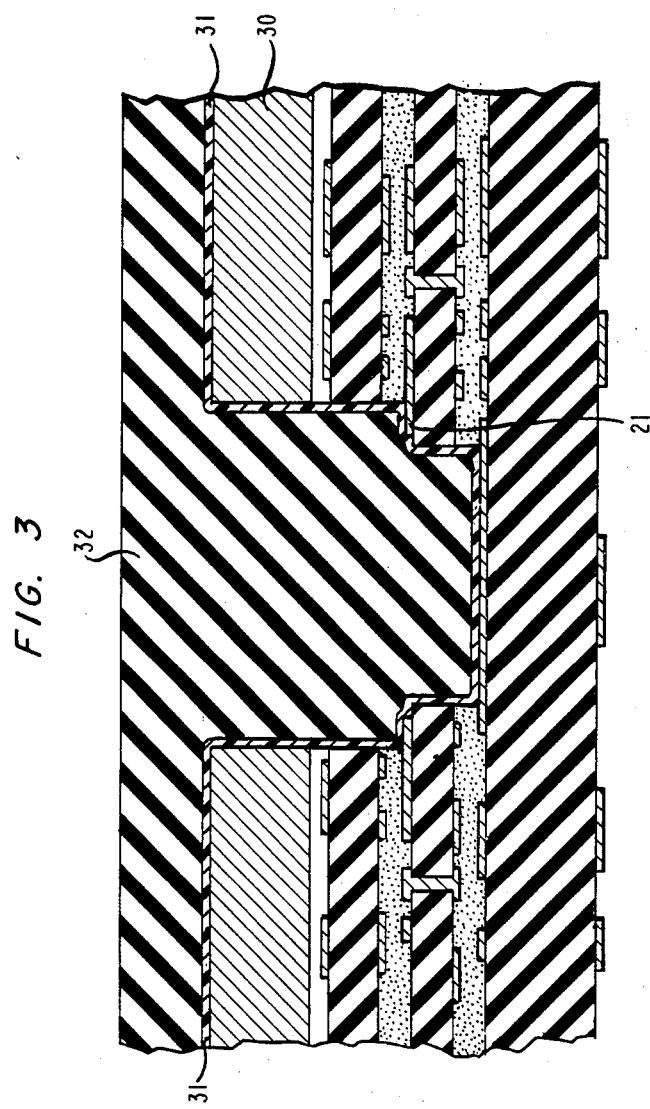

FIG. 2 illustrates a portion of a multilayer structure during one stage of fabrication in accordance with an embodiment of the invention. It will be appreciated that many packages such as shown in FIG. 1 are batch fabricated from a multilayer board panel which is typically approximately 46 cm × 61 cm with many cavities formed therein. FIGS. 2 and 3, therefore, show only the portion of the multilayer structure which will eventually result in a single package.

FIG. 2 illustrates the stage where the multiple layers, 15 and 16, have been stacked over the substrate, 10, with the adhesive layers, 25 and 26, provided therebetween, but prior to the lamination operation which will produce final bonding between the layers and substrate. Optionally, a template, 30, is provided on top of the multilayer structure. (The template is shown in the figures as lifted slightly above the multilayer structure for purposes of illustration.) This template is a thin sheet of material, in this case type 300 stainless steel with a thickness of approximately 0.046 cm, which has openings therein corresponding in size and position to the cavities formed in the multilayer structure. The purpose of the template is to distribute the stresses during the bonding operation to minimize bending of the edges of the layers 15 and 16 which include the bonding pads 21 and 22. Consequently, the template should be thin enough not to interfere with the bonding process, but thick enough and with enough bending strength to minimize bending of the layers at the cavity edges. A thickness of 250–750 microns is useful for this function. The template material should also have a coefficient of thermal expansion similar to the multilayer structure. In addition to stainless steel, a double-clad copper laminate approximately 350 microns thick was suitable.

Provided over the multilayer structure and template is a combination of a release film 31 and flowable conformal material 32. In particular, the release material, 31, which is in the form of a sheet, was placed on the template, 30, over the entire area of the panel including the portion shown in FIG. 2. The conformal material, 32, which was in the form of a tape, was laid on the release film as a series of contiguous stripes approximately 1.3 cm×45.7 cm to cover essentially the entire area of the release film. Thus, the film and material are placed in contact with the top of the structure (in this case the template) and with each other over the entire area of the structure including all the cavities. The release film is a thin layer of a material which will prevent the conformal material from bonding to the underlying structure. For reasons discussed below, it should also yield at relatively low stress and have high elongation, i.e. be capable of stretching without breaking. In particular, it is preferred that the release material have an elongation of greater than 200 percent with a yield stress of less than 13.8 MPa. One useful material is a fluoropolymer sold by Airtech under the designation Wrightlon 4600. Another useful material is tetrafluoroethylene tape. However, other materials capable of releasing the template, printed wiring board laminate and adhesive, and also having sufficient elongation can be employed. A preferred thickness is in the range 12.5 microns to 250 microns. If the layer is too thin it will tend to fracture, and if it is too thick, it will not conform to the shape of the cavity. In this example, the thickness was approximately 50 microns.

The conformal layer, 32, should comprise a material which is capable of flowing into and conforming to the dimensions of the chip cavity during the bonding operation to be described. In particular, the material should be capable of flowing into and filling the cavity before the adhesive, 25 and 26, softens and flows into the cavity. The material should also be thermally stable to withstand the temperature during the bonding operation. One useful material is a butyl rubber sealant tape such as that sold by Airtech under the designation "Airdam". This is a putty-like material with a viscosity of about 500,000 poise when measured with a Rheometrics Mechanical Spectrometer at a frequency of 1 radian per second and a strain of 15 percent at 25° C. In this example, a 0.32 cm thick tape of such material was utilized. In general, it is preferred to use a rubber which is flowable, (i.e. one which is not polymerized or only partially polymerized), and which has a putty-like consistency (i.e. a viscosity in the range 100,000 to 1,000,000 poise at 25° C.) In general, thicknesses of the conformal layer within the range 0.13 cm–1.3 cm should be appropriate. If the layer is too thin, if will not fill the cavity, and if it is too thick, it is not economical.

The structure in FIG. 2 is then subjected to a heat and pressure cycle for bonding the various layers together. That is, in this example, the structure is heated at a rate of 22° C./minute to a peak temperature of 177° C. where it is held for approximately 60 minutes at a pressure of 3.5 MPa in order to fully bond and polymerize the adhesive layers 15 and 16. As shown in FIG. 3, the heat and pressure cause the conformal layer, 32, to flow into and completely fill the cavity. The release layer, 31, stretches sufficiently without breaking to provide the necessary interface between the conformal coating and the multilayer structure. The conformal layer flows into the cavity prior to the flow of the adhesive layers so that the former acts as a dam against the flow of the latter into the cavity. The chip and wire bonding pads, 13 and 21, are therefore protected. Further, since the flow of the adhesive is now prevented, a wider processing window is provided for the bonding operation, both in the choice of adhesives and in the range of laminating cycles. In this example, heating at a rate in the range of 11°–30° C./minute to a peak temperature in the range 160°–190° C. for 30–90 minutes at a pressure of 1.7–4.8 Mpa may be utilized without adverse effects.

Subsequent to the bonding cycle, the conformal and release layers are mechanically lifted off the multilayer structure. This is done easily since the release layer prevents sticking of the conformal layer to the structure. The combination of conformal and release materials can then be discarded. The template, 30, is also mechanically lifted off the structure and can be reused. Normal processing of the cavity multilayer board, such as fabricating plated through holes (23 of FIG. 1), providing a covercoat (40 of FIG. 1), and assembly of connector pins (24 of FIG. 1) then proceeds.

While the invention has been described with respect to the fabrication of a chip cavity multilayer board, it should be appreciated that the inventive techniques should be applicable wherever multilayer electronic structures are fabricated which require protection of a recess in a nonplanar surface. For example, it may be desirable in some types of printed wiring boards to provide a thinner ledge around the border of a thicker board and to locate bonding pads on that ledge. In such cases, the ledge could be protected from adhesive between layers of the thicker portion of the board. Another possibility is to utilize the invention to prevent adhesive from oozing through via holes to the top of the multilayer structure.

Various additional modifications will become apparent to those skilled in the art. All such variations which basically rely on the teachings through which the invention has advanced the art are properly considered within the scope of the invention.

What is claimed is:

1. A method of fabricating a multilayer structure which includes a recess defined by a nonplanar surface comprising the step of providing a flowable adhesive between the layers for bonding the layers together and characterized by the steps of:

providing a release material and a flowable, conformal material thereon over the multilayer structure including the area over the recess; and applying heat and pressure to the structure sufficient to cause the conformal and release materials to fill the recess before the adhesive flows into the recess and thereby prevent the flow of adhesive into the recess.

2. The method according to claim 1 wherein the recess is a cavity defined by the multiple layers which is suitable for providing a semiconductor chip therein.

3. The method according to claim 1 wherein the conformal material comprise a flowable rubber with a putty-like consistency.

4. The method according to claim 1 wherein the release material comprises a material with an elongation of at least 200 percent and a yield stress of less than 13.8 MPa.

5. The method according to claim 2 further characterized by the step of providing a template between the multilayer structure and release material in areas of the structure outside the cavity in order to distribute stresses away from the edges of the layers defining the cavity.

6. The method according to claim 1 wherein the heat is applied at a rate of 5°–30° C./minute to a peak temperature in the range 160°–190° C. for a period of 30–90 minutes, and the pressure applied is in the range 0.8–4.8 MPa.

7. The method according to claim 1 further comprising the step of lifting off the conformal and release materials subsequent to the application of heat and pressure.

8. A method of fabricating a multilayer structure which includes a cavity defined by said layers suitable for providing a semiconductor chip therein, comprising the step of providing a flowable adhesive between the layers for bonding the layers together, and characterized by the steps of:

providing over the multilayer structure including the area over the cavity, a first layer of a release material having an elongation of at least 200 percent and a yield stress of less than 13.8 MPa;

providing over the release material a second layer of a conformal material comprising a flowable rubber with a putty-like consistency, and applying heat and pressure to the structure sufficient to cause the conformal and release materials to fill the cavity before the adhesive flows into the cavity and thereby prevent the flow of adhesive into the cavity.

9. The method according to claim 1 wherein the boundaries of the recess are defined by the layers and the adhesive extends to the boundaries.

10. The method according to claim 7 wherein the conformal and release materials are discarded after the fabrication of a single structure.

11. The method according to claim 1 wherein the release material and conformal material are provided as layers of uniform thickness over the area of the recess.

12. The method according to claim 8 wherein the adhesive extends to the boundaries of the cavity defined by said layers of the multilayer structure.

13. The methoding according to claim 8 further comprising the steps of lifting off the conformal and release layers and discarding said layers after the fabrication of a single structure.

14. The method according to claim 8 wherein the release material and conformal material are provided as layers of uniform thickness over the area of the cavity.

* * * * *